(12) United States Patent
Yokoi et al.

(10) Patent No.: US 11,978,192 B2
(45) Date of Patent: May 7, 2024

(54) COMPONENT MOUNTING MACHINE AND SUBSTRATE WORK SYSTEM

(71) Applicant: FUJI CORPORATION, Chiryu (JP)

(72) Inventors: Yuta Yokoi, Kariya (JP); Kazuya Kotani, Toyota (JP); Mikiya Suzuki, Nishio (JP)

(73) Assignee: FUJI CORPORATION, Chiryu (JP)

( * ) Notice: Subject to any disclaimer, the term of this patent is extended or adjusted under 35 U.S.C. 154(b) by 216 days.

(21) Appl. No.: 17/621,817

(22) PCT Filed: Jun. 27, 2019

(86) PCT No.: PCT/JP2019/025611
§ 371 (c)(1),
(2) Date: Dec. 22, 2021

(87) PCT Pub. No.: WO2020/261489
PCT Pub. Date: Dec. 30, 2020

(65) Prior Publication Data
US 2022/0245790 A1   Aug. 4, 2022

(51) Int. Cl.
*G06T 7/00*   (2017.01)
*G06V 10/62*   (2022.01)

(52) U.S. Cl.
CPC ............ *G06T 7/0006* (2013.01); *G06V 10/62* (2022.01); *G06T 2207/30152* (2013.01)

(58) Field of Classification Search
CPC ........ G06T 7/0006; G06T 2207/30152; G06V 10/62; H05K 13/083; H05K 13/0813
See application file for complete search history.

(56) References Cited

U.S. PATENT DOCUMENTS

| | | | |
|---|---|---|---|
| 2010/0125359 A1* | 5/2010 | Doyle | H05K 13/0061 700/114 |
| 2017/0325370 A1 | 11/2017 | Nozawa | |
| 2019/0274238 A1 | 9/2019 | Sugiyama et al. | |

FOREIGN PATENT DOCUMENTS

| | | | |
|---|---|---|---|
| JP | 2002368500 A | * | 12/2002 |
| JP | 2007-123807 A | | 5/2007 |
| JP | 4758263 B2 | | 8/2011 |

(Continued)

OTHER PUBLICATIONS

International Search Report dated Sep. 17, 2019 in PCT/JP2019/025611 filed on Jun. 27, 2019, 2 pages

*Primary Examiner* — Michael Lee
(74) *Attorney, Agent, or Firm* — Oblon, McClelland, Maier & Neustadt, L.L.P.

(57) ABSTRACT

A component mounting machine includes a component supply device, a head having a nozzle, and a control device configured to control each device. The control device is configured to control a cameras to image a component, determine the normality and abnormality of an operation executed immediately before a current imaging timing based on an image captured at the current imaging timing, classify the image captured at the current imaging timing as a normal image in a case in which a result of determination of the normality and abnormality is made as normal, and classify the image captured at the current imaging timing and a part or all of images captured at imaging timings prior to the current imaging timing as an abnormal image in a case in which the result of the determination of the normality and abnormality is made as abnormal.

9 Claims, 6 Drawing Sheets

(56) References Cited

FOREIGN PATENT DOCUMENTS

| WO | WO 2016/092651 A1 | 6/2016 | |
| WO | WO-2016092651 A1 * | 6/2016 | ......... H05K 13/0413 |
| WO | WO 2018/087932 A1 | 5/2018 | |

* cited by examiner

COMPONENT MOUNTING MACHINE AND SUBSTRATE WORK SYSTEM

TECHNICAL FIELD

The present description discloses a component mounting machine and a substrate work system.

BACKGROUND ART

Conventionally, a component mounting machine that mounts a component on a substrate is known. For example, a component mounting machine disclosed in Patent Literature 1 includes a component supply device that supplies a component to be mounted on a substrate, a head having a nozzle capable of holding the component, a movement device that moves the head in XY-directions, multiple cameras capable of imaging the component, and a control device that controls various devices. Examples of the multiple cameras include a part camera capable of imaging a lower surface of component picked up by the nozzle, and a side camera capable of imaging a side surface of component picked up by the nozzle. The control device detects an amount of positional deviation of the component with respect to the nozzle based on the image obtained by imaging the lower surface of component picked up by the nozzle. In addition, the control device images the component at an imaging timing before and after the component is mounted on the substrate at a predetermined position, and determines whether a positional deviation (mounting error) occurs.

PATENT LITERATURE

Patent Literature 1: International Publication No. WO2016/092651

BRIEF SUMMARY

Technical Problem

Incidentally, in such a component mounting machine, it is conceivable to classify images captured by a camera into a normal image and an abnormal image. For example, it is conceivable that in a case in which the amount of positional deviation of the component with respect to the nozzle is detected based on the image obtained by capturing the lower surface of component picked up by the nozzle, the image is classified as the normal image in a case in which the amount of positional deviation does not exceed an allowable range and the image is classified as the abnormal image in a case in which the amount of positional deviation exceeds the allowable range. In addition, it is conceivable to capture the image of the component at the imaging timing before and after the component is mounted on the substrate at the predetermined position and classify the image as the normal image in a case in which the mounting error does not occur, and classify the image as the abnormal image in a case in which the mounting error occurs. Here, in a case in which the mounting error occurs when the component is mounted on the substrate at the predetermined position, the image obtained by capturing the lower surface of the component remains classified as the normal image in a case in which the amount of positional deviation based on the image obtained by capturing the lower surface of component picked up by the nozzle does not exceed the allowable range.

However, as a result, in a case in which the mounting error occurs, there is a possibility that the calculation of the amount of positional deviation based on the image obtained by capturing the lower surface of the component is not correct. For example, there is a possibility that the component cannot be correctly extracted due to waste, dust, or the like in a case in which the component is extracted from the image obtained by capturing the lower surface of component picked up by the nozzle, so that the amount of positional deviation cannot be correctly calculated. In a case in which the image obtained by capturing the lower surface of the component with such a possibility is classified as the normal image, an adverse effect may be imparted in a case in which the image is used in a case of brushing up shape data or the like of the component.

The present description has been made to solve the problems described above, and is to prevent an image having a possibility of an abnormal image from being stored as a normal image.

Solution to Problem

A component mounting machine disclosed in the present description relates to a component mounting machine that mounts a component on a substrate, the machine including a component supply device configured to supply the component to be mounted on the substrate, a head having a nozzle capable of holding the component, a movement device configured to move the head in XY-directions, a control device configured to control the component supply device, the head, and the movement device such that a series of works including a pickup operation of picking up the component supplied from the component supply device by the nozzle of the head, a movement operation of moving the head to a predetermined position on the substrate, and a mounting operation of mounting component picked up by the nozzle at the predetermined position is executed, and one or multiple cameras configured to image the component at least two imaging timings during execution of the series of works, in which the control device is configured to control one of the one or multiple cameras to image the component when the imaging timing reaches, determine normality and abnormality of an operation executed immediately before a current imaging timing based on an image captured at the current imaging timing, classify the image captured at the current imaging timing as a normal image in a case in which a result of determination of the normality and abnormality is made as normal, and classify the image captured at the current imaging timing and a part or all of images captured at imaging timings prior to the current imaging timing as an abnormal image in a case in which the result of the determination of the normality and abnormality is made as abnormal.

In the component mounting machine, the component is imaged when the imaging timing reaches, the determination of the normality and abnormality of the operation executed immediately before the current imaging timing is made based on the image captured at the current imaging timing, and the image captured at the current imaging timing is classified as the normal image in a case in which the result of the determination of the normality and abnormality is made as normal. On the other hand, the image captured at the current imaging timing and a part or all of the images captured at the imaging timings prior to the current imaging timing are classified as the abnormal image in a case in which the result of the normality and abnormality determination is made as abnormal. That is, in a case in which the determination is made that the operation executed immediately before the current imaging timing is abnormal based on the image captured at the current imaging timing, there is a possibility that the determination based on the image captured at the imaging timing prior to the current imaging timing should have also originally been made as abnormal, and thus the image captured at the current imaging timing and a part or all of the images captured at the imaging timings prior to the current imaging timing are classified as the abnormal image. As a result, it is possible to prevent the image having a possibility of the abnormal image from being stored as the normal image.

It should be noted that the control device may be configured by one control section or may be configured by two or more control sections. In the latter case, for example, the control section may be divided into a control section that controls the component supply device, the head, the movement device, and the camera and determines the normality and abnormality of the operation and a control section (management section) that classifies the images into the normal image or the abnormal image.

DESCRIPTION OF EMBODIMENTS

Figure 1:
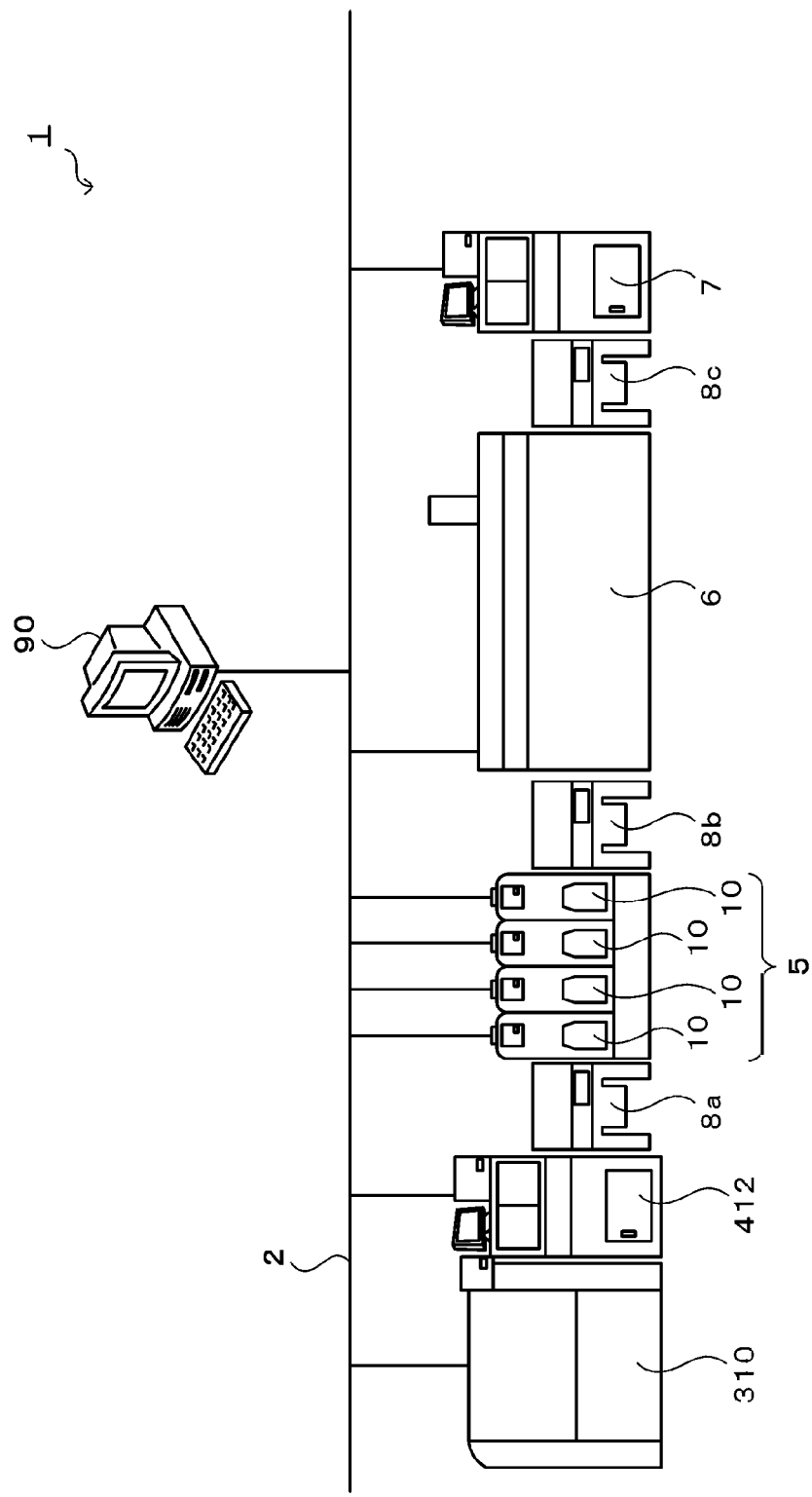
FIG. 1 is an explanatory diagram showing an outline of a configuration of substrate work system 1.

Hereinafter, an embodiment of the present disclosure will be described. FIG. 1 is an explanatory diagram showing an outline of a configuration of substrate work system 1, FIG. 2 is an explanatory diagram showing an outline of a configuration of component mounting module 10, FIG. 3 is an explanatory diagram showing an outline of a configuration of head unit 40, and FIG. 4 is a block diagram showing an electrical connection relationship between component mounting module 10 and management server 90.

As shown in FIG. 1, substrate work system 1 includes solder paste printing machine 3, solder paste inspection machine 4, mounting line 5, reflow furnace 6, and substrate appearance inspection machine 7. Mounting line 5 is configured by multiple component mounting modules 10 disposed in a row. Each of machines 3, 4, 5, 6, and 7 is connected to management server 90 via communication network (for example, LAN) 2 so as to be capable of bidirectional communication.

An outline of an operation of each machine constituting substrate work system 1 will be described. Each machine executes a process in accordance with a production job transmitted from management server 90. The production job is information for determining which component type of component is to be mounted on which position of the substrate in which order in each component mounting module 10, how many substrates on which the component is mounted, and the like. Solder paste printing machine 3 prints a solder paste in a predetermined pattern at a position at which each component is to be mounted on a surface of the substrate conveyed from an upstream side, and conveys out to solder paste inspection machine 4 on a downstream side. Solder paste inspection machine 4 performs an inspection as to whether the solder paste is correctly printed on the conveyed substrate. The substrate on which the solder paste is correctly printed is supplied to component mounting module 10 in mounting line 5 via intermediate conveyor 8a. Multiple component mounting modules 10 disposed in mounting line 5 perform component mounting on the substrate in order from the upstream side. The substrate on which the mounting of all of the components is completed is supplied from component mounting module 10 to reflow furnace 6 via intermediate conveyor 8b. In reflow furnace 6, since the solder paste of the substrate is melted and then solidified, each component is fixed on the substrate. The substrate conveyed from reflow furnace 6 is conveyed into substrate appearance inspection machine 7 via intermediate conveyor 8c. Substrate appearance inspection machine 7 determines the normality and abnormality of an appearance inspection based on an image for appearance inspecting obtained by imaging the substrate on which all of the components are mounted.

Figure 2:
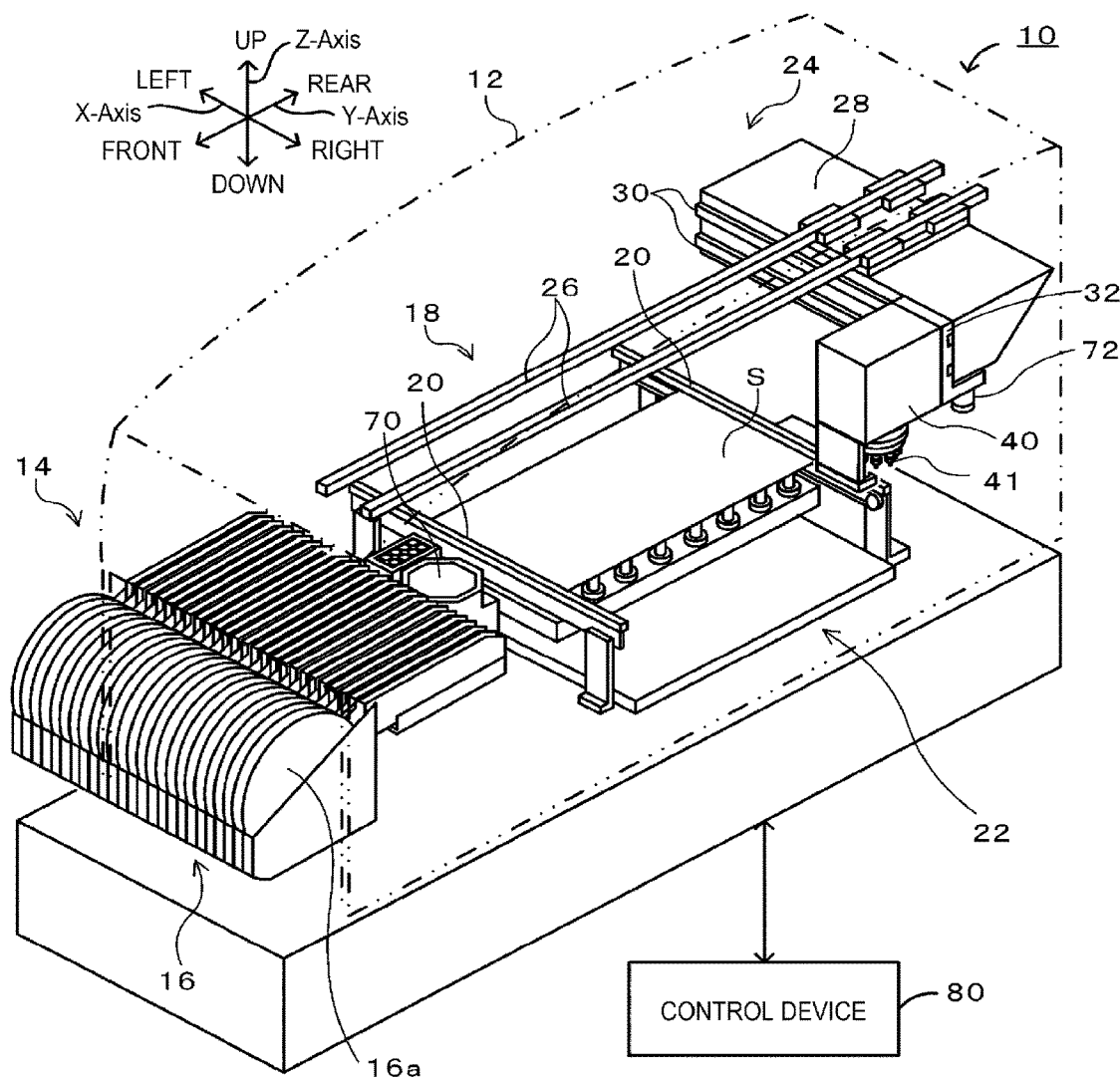
FIG. 2 is an explanatory diagram showing an outline of a configuration of component mounting module 10.
Figure 3:
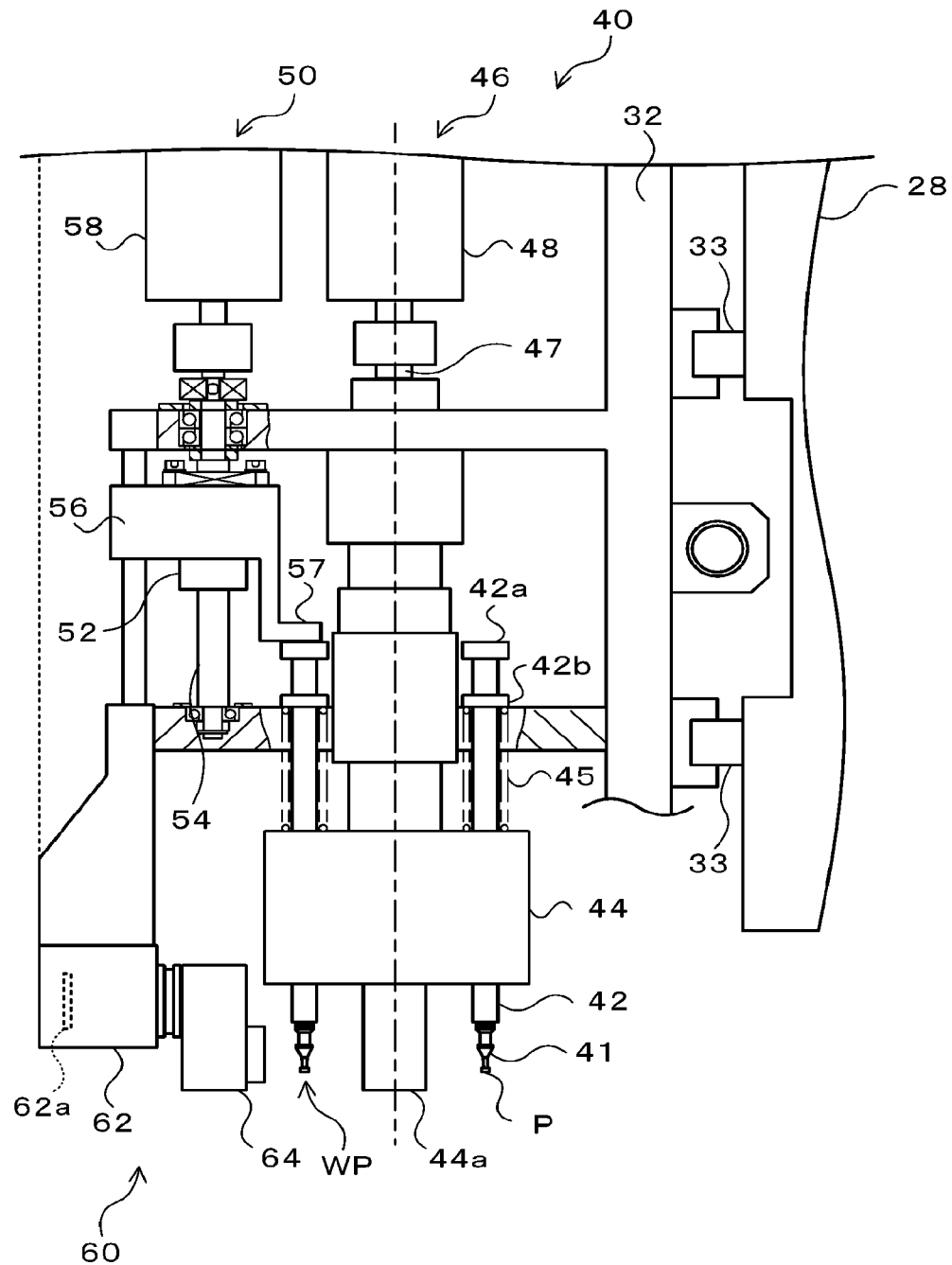
FIG. 3 is an explanatory diagram showing an outline of a configuration of head unit 40.
Figure 4:
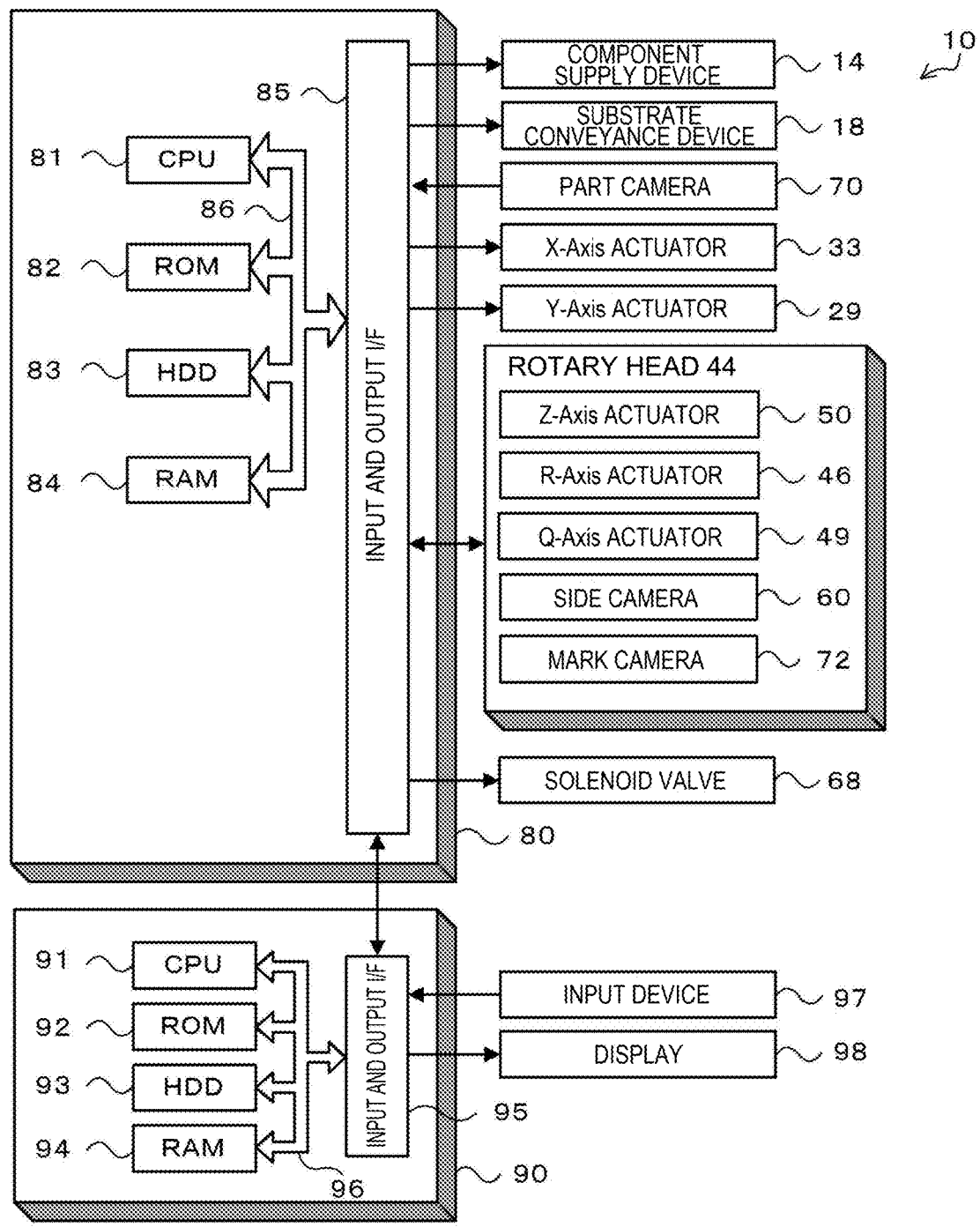
FIG. 4 is a block diagram showing an electrical connection relationship between component mounting module 10 and management server 90.

As shown in FIG. 2, component mounting module 10 includes component supply device 14, substrate conveyance device 18, XY-robot (movement device) 24, head unit 40, part camera 70, mark camera 72, and controller 80 (refer to FIG. 4). It should be noted that, in the present embodiment, a right-left direction in FIG. 2 is an X-axis direction, a front-rear direction is a Y-axis direction, and an up-down direction is a Z-axis direction.

Component supply device 14 includes tape feeder 16 detachably attached to a front side of housing 12. Tape feeder 16 includes reel 16a on which a tape in which components P are accommodated at predetermined intervals is wound, and drives a drive motor (not shown) and pulls the tape from reel 16a to feed component P to a component supply position.

Substrate conveyance device 18 includes belt conveyor device 20, and conveys substrate S from the left to the right in FIG. 2 (substrate conveyance direction) by driving belt conveyor device 20. Substrate supporting device 22 that supports the conveyed substrate S from a rear surface side by a support pin is provided on a center portion of substrate conveyance device 18 in the substrate conveyance direction (X-axis direction).

As shown in FIG. 2, XY-robot 24 includes Y-axis guide rail 26, Y-axis slider 28, X-axis guide rail 30, and X-axis slider 32. Y-axis guide rail 26 is provided on an upper portion of the device along the Y-axis direction. Y-axis slider 28 is movable along Y-axis guide rail 26. X-axis guide rail 30 is provided on a front surface of Y-axis slider 28 along the X-axis direction. X-axis slider 32 is attached with head unit 40 and is movable along X-axis guide rail 30. As a result, XY-robot 24 can move head unit 40 in XY-directions.

As shown in FIG. 3, head unit 40 includes rotary head 44, R-axis actuator 46, Z-axis actuator 50, and side camera 60.

In rotary head 44, multiple (12 in this case) nozzle holders 42 that holds suction nozzles 41 are disposed at predetermined angular intervals (for example, 30 degrees) on a circumference coaxial with a rotation shaft. Nozzle holder 42 is configured as a hollow cylindrical member that extends in the Z-axis direction. Upper end portion 42a of nozzle holder 42 is formed in a cylindrical shape having a larger diameter than a shaft section of nozzle holder 42. In addition, nozzle holder 42 is formed with flange section 42b having a larger diameter than the shaft section at a predetermined position on a lower side of upper end portion 42a. Spring (coil spring) 45 is disposed between a circular annular surface on a lower side of flange section 42b and a recess (not shown) formed in an upper surface of rotary head 44. Therefore, spring 45 urges nozzle holder 42 (flange section 42b) upward with the recess on the upper surface of rotary head 44 serving as a spring receiver. Cylindrical reflective body 44a that can reflect light is attached to the center of a lower surface of rotary head 44. Rotary head 44 includes Q-axis actuator 49 (refer to FIG. 4) that individually rotates each nozzle holder 42 therein. Although not shown, Q-axis actuator 49 includes a driving gear meshed with a gear provided on a cylinder outer periphery of nozzle holder 42, and a drive motor connected to a rotation shaft of the drive gear. Therefore, multiple nozzle holders 42 can be individually rotated around the axis (Q direction), so that each suction nozzle 41 can also be individually rotated.

R-axis actuator 46 includes rotation shaft 47 connected to rotary head 44, and drive motor 48 connected to rotation shaft 47. R-axis actuator 46 intermittently rotates rotary head 44 by a predetermined angle by intermittently driving drive motor 48 by a predetermined angle (for example, 30 degrees). As a result, each nozzle holder 42 disposed in rotary head 44 is pivot moved by a predetermined angle in a circumferential direction. Here, nozzle holder 42 picks component P up supplied from component supply device 14 to the component supply position by suction nozzle 41 or places component P picked up by suction nozzle 41 on a predetermined disposition position on substrate S when nozzle holder 42 is positioned at predetermined work position WP (position in FIG. 3) among multiple movable positions Z-axis actuator 50 is configured as a feed screw mechanism including screw shaft 54 that extends in the Z-axis direction to move ball screw nut 52, Z-axis slider 56 attached to ball screw nut 52, and drive motor 58 of which a rotation shaft is connected to screw shaft 54. Z-axis actuator 50 moves Z-axis slider 56 in the Z-axis direction by rotationally driving drive motor 58. Substantially L-shaped lever section 57 that protrudes to a side of rotary head 44 is formed on Z-axis slider 56. Lever section 57 can abut upper end portion 42a of nozzle holder 42 positioned within a predetermined range including work position WP. Therefore, in a case in which lever section 57 is moved in the Z-axis direction in accordance with the movement of Z-axis slider 56 in the Z-axis direction, nozzle holder 42 (suction nozzle 41) positioned within the predetermined range can be moved in the Z-axis direction.

Side camera 60 includes camera main body 62 provided on a lower portion of head unit 40 and incorporating imaging element 62a, such as CCD or CMOS, and optical system 64 that forms an image on imaging element 62a. Optical system 64 is provided with multiple light emitting bodies, such as LED, that emit light toward reflective body 44a of rotary head 44. Optical system 64 includes a mirror that refracts the light incident from the outside and guides the light to imaging element 62a. Side camera 60 images the side surface of suction nozzle 41 stopped at work position WP and component P picked up by suction nozzle 41.

As shown in FIG. 2, part camera 70 is disposed between component supply device 14 and substrate conveyance device 18. Part camera 70 has an imaging range on an upper side of part camera 70, and images component P held by suction nozzle 41 from the lower side to generate a captured image.

As shown in FIG. 2, mark camera 72 is provided on a lower surface of X-axis slider 32. Mark camera 72 images a target object from the upper side to generate the captured image. Examples of an imaging target object by mark camera 72 include component P held on a tape fed from tape feeder 16 of component supply device 14, a mark attached to substrate S, component P after being mounted on substrate S, and the solder printed on substrate S.

As shown in FIG. 4, controller 80 is configured as a microprocessor centered on CPU 81, and includes ROM 82, HDD 83, RAM 84, input and output interface 85, and the like in addition to CPU 81. These components are connected via bus 86. Controller 80 inputs an image signal or the like from side camera 60, part camera 70, or mark camera 72 via input and output interface 85. It should be noted that each of X-axis slider 32, Y-axis slider 28, Z-axis actuator 50, Q-axis actuator 49, and R-axis actuator 46 is equipped with a position sensor (not shown), and controller 80 also inputs positional information from the position sensors. In addition, controller 80 outputs, via input and output interface 85, a drive signal and the like to component supply device 14, substrate conveyance device 18, X-axis actuator 33 that moves X-axis slider 32, Y-axis actuator 29 that moves Y-axis slider 28, Z-axis actuator 50 (drive motor 58), Q-axis actuator 49 (drive motor), R-axis actuator 46 (drive motor 48), or solenoid valve 68 that performs communication and shutoff between a vacuum pump (not shown) and suction nozzle 41.

As shown in FIG. 4, management server 90 includes CPU 91, ROM 92, HDD 93 that stores the production job of substrate S, RAM 94, input and output interface 95, or the like. These components are connected via bus 96. An input signal from input device 97, such as a mouse or a keyboard, is input to management server 90 via input and output interface 95. Management server 90 outputs an image signal to display 98 via input and output interface 95. Here, the production job of substrate S is data for determining which component P is to be mounted on substrate S in which order in component mounting module 10, how many substrates S on which component P is mounted in this manner, and the like. The production job is input in advance by an operator, and is transmitted from management server 90 to component mounting module 10 in a case in which the production is started. Management server 90 receives the images captured by each of cameras 60, 70, and 72 from controller 80 of component mounting module 10, classifies the images into a normal image or an abnormal image, and stores the classified images in HDD 93.

Figure 5:
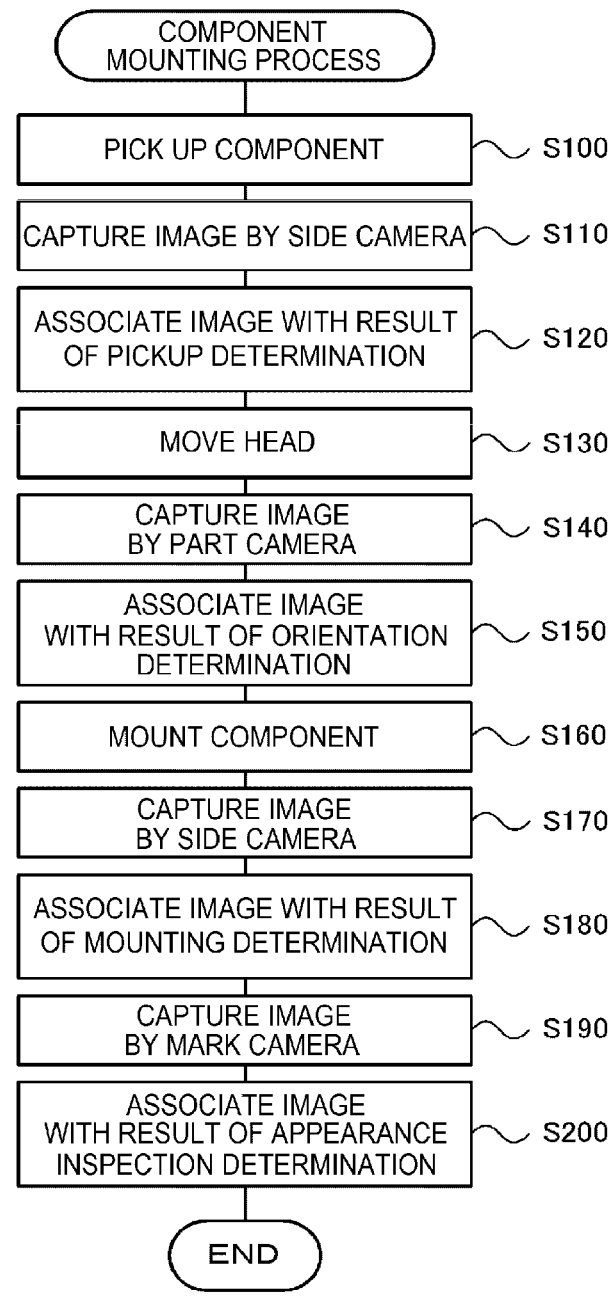
FIG. 5 is a flowchart showing an example of a component mounting process.

Hereinafter, an operation of component mounting module 10 will be described. FIG. 5 is a flowchart showing an example of a component mounting process executed by CPU 81 of controller 80. The process is started when the production job is received from management server 90 and an instruction for starting the production is given. It should be noted that in the component mounting process, a series of works are executed in which component P supplied from component supply device 14 is picked up by each suction nozzle 41 of rotary head 44 (pickup operation), rotary head 44 is moved to substrate S (movement operation), and component P picked up by each suction nozzle 41 is mounted on substrate S at the predetermined disposition position (mounting operation). The component mounting process is repeatedly executed until all of components P assigned to component mounting modules 10 are mounted on substrate S supported by substrate supporting device 22.

In the component mounting process, CPU 81 first causes suction nozzle 41 of rotary head 44 to pick component P up (S100). Here, CPU 81 controls X-axis actuator 33, Y-axis actuator 29, and R-axis actuator 46 such that work position WP of rotary head 44 is moved to the component supply position of component supply device 14, controls Z-axis actuator 50 such that suction nozzle 41 at work position WP is lowered, and controls solenoid valve 68 such that a negative pressure acts on suction nozzle 41 and component P is picked up by suction nozzle 41 (pickup operation). Subsequently, CPU 81 images a distal end of suction nozzle 41 at work position WP by side camera 60 (S110). Subsequently, CPU 81 performs a pickup determination as to whether component P is correctly picked up by the distal end of suction nozzle 41 based on the captured image, and transmits the image captured by side camera 60 and a result of the pickup determination to management server 90 together with identification information of component P (S120). The pickup determination is made as normal in a case in which component P is appearing at the distal end of suction nozzle 41 and a length of appearing component P in the up-down direction is within an allowable range, or as abnormal otherwise. For example, in a case in which component P has a rectangular parallelepiped shape, when component P should be picked up such that a longitudinal direction thereof is horizontal, but the longitudinal direction of component P is oblique, the length of appearing component P in the up-down direction exceeds the allowable range. Therefore, component P, which is obliquely picked up, is determined as abnormal. Such processes in steps S100 to S120 are executed for all of suction nozzles 41 while sequentially positioning each of multiple suction nozzles 41 held by rotary head 44 at work position WP.

Hereinafter, CPU 81 controls X-axis actuator 33 and Y-axis actuator 29 to move rotary head 44 from an upper side of component supply device 14 to an upper side of substrate S (S130). Rotary head 44 is moved via the upper side of part camera 70. In a case in which rotary head 44 passes through the upper side of part camera 70, CPU 81 images component P picked up by suction nozzle 41 by part camera 70 (S140). Subsequently, CPU 81 performs the determination as to whether component P is correctly picked up by the distal end of suction nozzle 41 based on the captured image, and transmits the image captured by part camera 70 and the result of the pickup determination to management server 90 together with the identification information of component P (S150). Here, the pickup determination is made as normal in a case in which component P is appearing at the distal end of suction nozzle 41 and an amount of positional deviation of appearing component P is within the allowable range, or as abnormal otherwise. The amount of positional deviation is used to correct the position of component P when component P is placed at the predetermined disposition position on substrate S. In a case in which the amount of positional deviation exceeds the allowable range, the position of component P cannot be corrected completely, and thus it is determined as abnormal. Such processes in steps S130 to S150 are executed for all of suction nozzles 41 held by rotary head 44.

Hereinafter, CPU 81 mounts component P on substrate S at the predetermined disposition position (S160). Here, CPU 81 controls R-axis actuator 46 such that suction nozzle 41 that picks component P up, which is a mounting target, approaches at work position WP of rotary head 44, and controls X-axis actuator 33 and Y-axis actuator 29 such that work position WP is moved to the predetermined disposition position. In addition, CPU 81 controls Z-axis actuator 50 such that suction nozzle 41 at work position WP is lowered, and controls solenoid valve 68 such that a positive pressure acts on suction nozzle 41 and component P is detached from suction nozzle 41 and placed at the predetermined disposition position (mounting operation). Subsequently, CPU 81 images the distal end of suction nozzle 41 at work position WP by side camera 60 (S170). Subsequently, CPU 81 performs a mounting determination as to whether component P is mounted on substrate S based on the captured image, and transmits the image captured by side camera 60 and a result of the mounting determination to management server 90 together with the identification information of component P (S180). The mounting determination is made as normal in a case in which component P is not appearing at the distal end of suction nozzle 41, or as abnormal otherwise. The processes in steps S160 to S180 are executed for all of suction nozzles 41 while sequentially positioning each of multiple suction nozzles 41 held by rotary head 44 at work position WP.

Hereinafter, CPU 81 images a portion of substrate S on which component P is mounted by mark camera 72 (S190). Here, CPU 81 controls X-axis actuator 33 and Y-axis actuator 29 such that mark camera 72 is disposed immediately above the portion of substrate S on which component P is mounted, and images the portion by mark camera 72. Subsequently, CPU 81 performs an appearance inspection as to whether component P is correctly mounted on substrate S at the predetermined disposition position based on the captured image, transmits the image captured by mark camera 72 and an appearance inspection result to management server 90 together with the identification information of component P (S200), and terminates the component mounting process. In the appearance inspection, the determination is made as normal in a case in which component P is accommodated within the allowable range from the predetermined disposition position on substrate S, or as abnormal otherwise. The processes in steps S190 to S200 are executed on all of components P to be mounted on substrate S by component mounting module 10. It should be noted that in the flowchart of the component mounting process, the series of subsequent works may be canceled for component P determined as abnormal.

Figure 6:
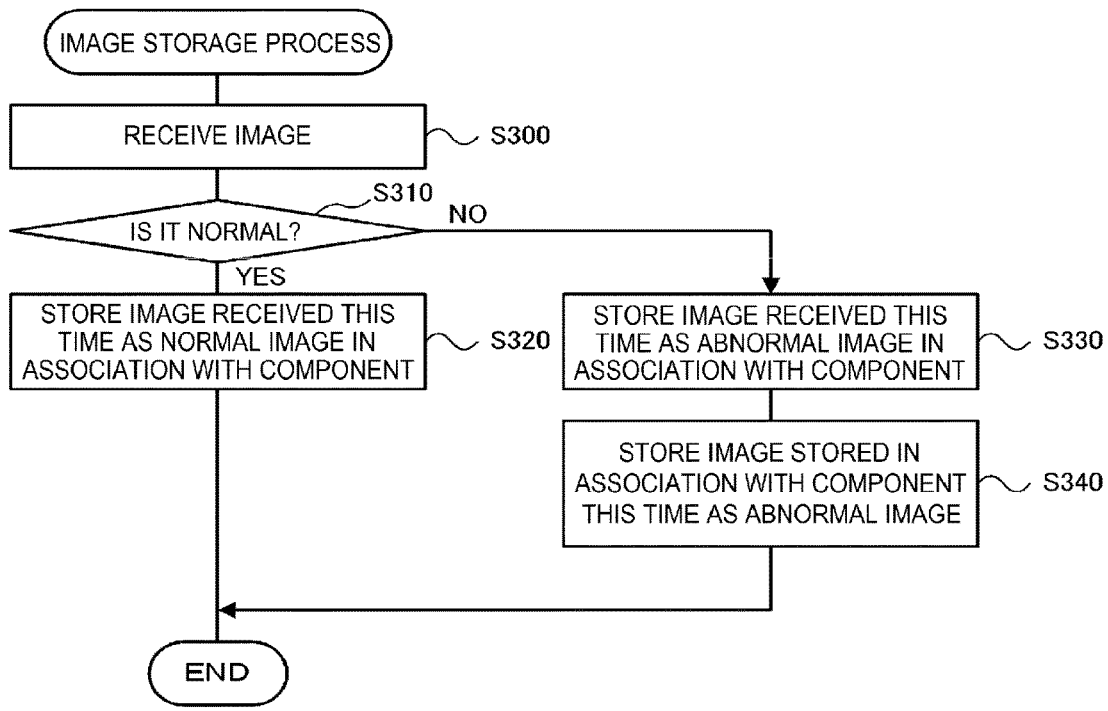
FIG. 6 is a flowchart showing an example of an image storage process.

Hereinafter, an operation of management server 90 will be described. FIG. 6 is a flowchart showing an example of an image storage process executed by CPU 91 of management server 90. The process is executed each time management server 90 receives the image from component mounting module 10.

In the image storage process, first, CPU 91 receives the image transmitted from component mounting module 10 together with the identification information of component P or the result of determination (S300). Subsequently, CPU 91 performs a determination as to whether the result of determination attached to the image is normal or abnormal (S310), in a case in which determination is made as normal, stores the image received this time as the normal image in HDD 93 in association with the identification information of current component P appearing in the image (S320), and terminates the image storage process. On the other hand, in a case in which the determination is made as abnormal in S 310, CPU 91 stores the image received this time as the abnormal image in HDD 93 in association with the identification information of current component P appearing in the image (S330), further classifies the normal image stored in HDD 93 in association with the identification information of current component P as the abnormal image (S340), and terminates the image storage process. The image finally classified as the normal image is used in a case of editing component-related data (for example, shape data of the component).

Figure 7:
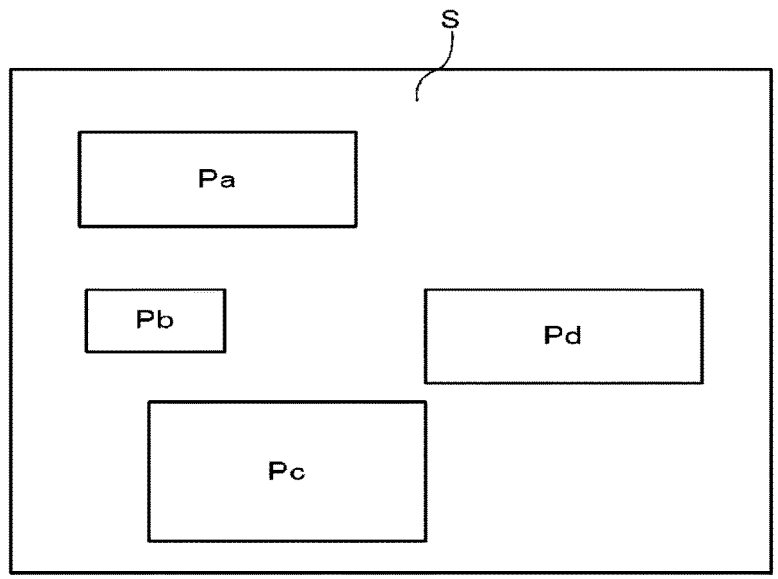
FIG. 7 is a plan view of substrate S on which components Pa to Pd are mounted.

Hereinafter, the image storage process will be described with reference to FIG. 7. FIG. 7 is a plan view of substrate S on which components Pa to Pd are mounted. It is assumed that components Pa to Pd are mounted on substrate S in this order (alphabetical order) by component mounting module 10. It should be noted that the image transmitted from component mounting module 10 to management server 90 is assumed to be attached with an imaging condition (camera type and imaging timing) in addition to the identification information of component P appearing in the image.

In a case in which all of the images captured at any of the imaging timings of components Pa to Pd are normal, image classification data as shown in Table 1 is stored in HDD 93 of management server 90. On the other hand, in a case in which although all of the images captured at any imaging timings for components Pa to Pc are normal, the images of component Pd after component pickup and during head movement are normal and the subsequent image thereof after component mounting is abnormal, the image classification data as shown in Table 2 is stored in HDD 93 of management server 90 temporarily (S330 in FIG. 6). Thereafter, the image stored in association with current component Pd is classified again as the abnormal image and stored (S340 in FIG. 6). As a result, the image classification data as shown in Table 3 is stored in HDD 93. That is, the image of component Pd after the component pickup and the image during the head movement are classified from the normal image to the abnormal image. It should be noted that component mounting module 10 cancels the series of works for component Pd (here, imaging by mark camera 72 after the component is mounted) after the determination is made as abnormal.

TABLE 1

| Imaging condition | Camera type | Side camera After Imaging timing | Part camera During component pickup | Side camera After head movement | Mark camera After component mounting |
|---|---|---|---|---|---|
| Component | Pa | Normal | Normal | Normal | Normal |
|  | Pb | Normal | Normal | Normal | Normal |
|  | Pc | Normal | Normal | Normal | Normal |
|  | Pd | Normal | Normal | Normal | Normal |

TABLE 2

| Imaging condition | Camera type | Side camera After Imaging timing | Part camera During component pickup | Side camera After head movement | Mark camera After component mounting |
|---|---|---|---|---|---|
| Component | Pa | Normal | Normal | Normal | Normal |
|  | Pb | Normal | Normal | Normal | Normal |
|  | Pc | Normal | Normal | Normal | Normal |
|  | Pd | Normal | Normal | Normal | Abnormal |

TABLE 3

| Imaging condition | Camera type | Side camera After Imaging timing | Part camera During component pickup | Side camera After head movement | Mark camera After component mounting |
|---|---|---|---|---|---|
| Component | Pa | Normal | Normal | Normal | Normal |
|  | Pb | Normal | Normal | Normal | Normal |
|  | Pc | Normal | Normal | Normal | Normal |
|  | Pd | Abnormal | Abnormal | Abnormal |  |

Here, a correspondence between the constituent elements of the present embodiment and the constituent elements of the component mounting machine disclosed in the present description will be described. Component mounting module 10 and management server 90 of the present embodiment correspond to the component mounting machine disclosed in the present description, component supply device 14 corresponds to the component supply device, XY-robot 24 corresponds to the movement device, side camera 60, part camera 70, and mark camera 72 correspond to the camera, and controller 80 and management server 90 correspond to the control device.

In the present embodiment described above, component P is imaged when the imaging timing reaches, the determination of the normality and abnormality of the operation executed immediately before the current imaging timing is made based on the image captured at the current imaging timing, and the image captured at the current imaging timing is classified as the normal image in a case in which the determination result of the normality and abnormality is made as normal. On the other hand, the image captured at the current imaging timing and a part or all of the images captured at the imaging timings prior to the current imaging timing are classified as the abnormal image in a case in which the result of the normality and abnormality determination is made as abnormal. That is, in a case in which the determination is made that the operation executed immediately before the current imaging timing is abnormal based on the image captured at the current imaging timing, there is a possibility that the determination based on the image captured at the imaging timing prior to the current imaging timing should have also originally been made as abnormal, and thus the image captured at the current imaging timing and a part or all of the images captured at the imaging timings prior to the current imaging timing are classified as the abnormal image. As a result, it is possible to prevent the image having a possibility of the abnormal image from being stored as the normal image.

In addition, controller 80 continues the series of works in a case in which the result of the determination of the normality and abnormality of the operation executed immediately before the current imaging timing is normal, or cancels the series of works in a case in which the result of the determination is made as abnormal. That is, since controller 80 cancels the series of works after the determination is made as abnormal, it is possible to prevent wasteful time or wasteful imaging.

In addition, the imaging timing includes a timing immediately after the pickup operation, a timing in the middle of the movement operation, a timing immediately after the mounting operation, and a timing of the appearance inspection. An error occurred in a case in which component P is picked up from component supply device 14 can be determined based on the image captured at the timing immediately after the pickup operation. An orientation (positional deviation) of component P picked up by suction nozzle 41 can be determined based on the image captured at the timing in the middle of the movement operation. An error occurred in a case in which component P is mounted on substrate S can be determined based on the image captured at the timing immediately after the mounting operation. An error regarding component P mounted on substrate S can be determined based on the image captured at the timing of the appearance inspection.

Moreover, in a case in which the result of the determination of the normality and abnormality of the operation executed immediately before the current imaging timing is abnormal, controller 80 classifies the image captured at the current imaging timing and all of the images captured at the imaging timings prior to the current imaging timing as the abnormal image. Therefore, it is possible to reliably prevent the image having a possibility of the abnormal image from being stored as the normal image.

Moreover, since the image finally classified as the normal image has high reliability, the component-related data can be brushed up using the image.

It should be noted that the present disclosure is not limited to the embodiment described above at all, and it is needless to say the present disclosure can be carried out in various aspects without departing from the scope the present disclosure.

For example, although management server 90 executes the image storage process (FIG. 6) in the embodiment described above, controller 80 of component mounting module 10 may execute the image storage process.

In the image storage process (FIG. 6) of the embodiment described above, in a case in which the determination is made that the received image is the abnormal image, the image received this time and all of the images stored in association with component P appearing in the image are stored as the abnormal image (S330 and S340), however, only the image received this time and a part of the images stored in association with the component appearing in the image (for example, images determined as the same group in advance) may be stored as the abnormal image. Examples of the image determined as the same group include images captured by the same camera. As a result, for example, the image having low reliability (such as an image captured by the same camera as the image captured this time) among the images captured at the imaging timing prior to the current imaging timing can be stored as the abnormal image, whereas the image having high reliability can be left as the normal image.

In the embodiment described above, management server 90 may receive the image for appearance inspecting from substrate appearance inspection machine 7 in addition to the reception of the image of component P from component mounting module 10 in S300 of the image storage process (see FIG. 6). In this case, management server 90 determines in S310 in FIG. 6 whether the result of determination attached to the image for appearance inspecting is normal or abnormal, and in a case in which the determination is made as normal, stores the image for appearance inspecting in HDD 93 in association with the identification information of current component P appearing in the image as the normal image (S320). On the other hand, in a case in which the determination is made as abnormal in S310, management server 90 stores the image for appearance inspecting in HDD 93 in association with the identification information of current component P appearing in the image as the abnormal image (S330), and further classifies the normal image stored in HDD 93 in association with the identification information of current component P as the abnormal image and stores the classified abnormal image (S340). That is, the determination is made as abnormal in the appearance inspection, there is a possibility that the determination based on the image captured at the imaging timing prior to the appearance inspection should have also originally been made as abnormal, and thus the appearance inspection image and the images captured in component mounting module 10 at the imaging timings prior to the appearance inspection are classified as the abnormal image. As a result, it is possible to prevent the image having a possibility of the abnormal image from being stored as the normal image. It should be noted that in this case, the imaging timing in component mounting module 10 need only be at least once, and, for example, S110, S120, S170 to S200 of the component mounting process in FIG. 5 may be omitted, and only the imaging timing (imaging of component P from the lower side) when suction nozzle 41 that holds component P passes through the upper side of part camera 70 may be used.

In the embodiment described above, as an example, a case has been described in which the image captured by side camera 60, the image captured by part camera 70, and the image captured by mark camera 72 are used, but the number of cameras is not particularly limited. For example, one of these cameras may be used. In a case in which one camera is used, component P need only be imaged by the camera at least two imaging timings.

In the embodiment described above, the image captured by side camera 60 may include nozzle 41 positioned at work position WP, as well as nozzles 41 positioned on both sides of work position WP.

The component mounting machine disclosed in the present description and the substrate work system including the same may be configured as follows.

In the component mounting machine disclosed in the present description, the control device may be configured to classify the image captured at the current imaging timing as the normal image and continue the series of works in a case in which the result of the determination of the normality and abnormality is made as normal, and classify the image captured at the current imaging timing and a part or all of the images captured at the imaging timings prior to the current imaging timing as the abnormal image and cancel the series of works in a case in which the result of the determination of the normality and abnormality is made as abnormal. As a result, since the series of works is canceled after the determination is made as abnormal, it is possible to prevent wasteful time or wasteful imaging.

In the component mounting machine disclosed in the present description, the imaging timing may be at least two of a timing immediately after the pickup operation, a timing in a middle of the movement operation, and a timing immediately after the mounting operation. The error occurred in a case in which the component is picked up from the component supply device can be determined based on the image captured at the timing immediately after the pickup operation. The orientation (positional deviation) of the component picked up by the nozzle can be determined based on the image captured at the timing in the middle of the movement operation. The error occurred in a case in which the component is mounted on the substrate can be determined based on the image captured at the timing immediately after the mounting operation.

In the component mounting machine disclosed in the present description, the series of works may include an appearance inspection of the substrate executed after the mounting operation, and the imaging timing may be at least two of a timing immediately after the pickup operation, a timing in a middle of the movement operation, a timing immediately after the mounting operation, and a timing of the appearance inspection. The error regarding the component mounted on the substrate can be determined based on the image captured at the timing of the appearance inspection.

In the component mounting machine disclosed in the present description, the control device may be configured to classify the image captured at the current imaging timing and all of the images captured at the imaging timings prior to the current imaging timing as the abnormal image in a case in which the result of the determination of the normality and abnormality is abnormal. As a result, it is possible to reliably prevent the image having a possibility of the abnormal image from being stored as the normal image.

In the component mounting machine disclosed in the present description, the control device may be configured to classify the image captured at the current imaging timing and the image captured at the imaging timing prior to the current imaging timing and decided as the abnormal image in advance in a case in which the result of the determination of the normality and abnormality is abnormal. As a result, for example, the image having low reliability (such as an image captured by the same camera as the image captured this time) among the images captured at the imaging timing prior to the current imaging timing can be stored as the abnormal image, whereas the image having high reliability can be left as the normal image.

In the component mounting machine disclosed in the present description, the image classified as the normal image may be used in a case of editing component-related data. The image classified as the normal image has high reliability, and thus the component-related data can be brushed up using the image.

A substrate work system disclosed in the present description relates to a substrate work system including the component mounting machine according to any one of the above description, and a substrate inspection machine disposed on downstream of the component mounting machine and configured to determine normality and abnormality of an appearance inspection based on an image for appearance inspecting obtained by imaging the substrate on which the component is mounted, in which the control device is configured to classify the image for appearance inspecting as the normal image in a case in which a result of determination of the normality and abnormality of the appearance inspection is normal, and classify the image for appearance inspecting and a part or all of images captured by the component mounting machine at imaging timings prior to the appearance inspection as the abnormal image in a case in which the result of the determination is abnormal.

In the substrate work system, the determination is made as abnormal in the appearance inspection, there is a possibility that the determination based on the image captured at the imaging timing prior to the appearance inspection should have also originally been made as abnormal, and thus the appearance inspection image and a part or all of images captured in the component mounting machine at the imaging timings prior to the appearance inspection are classified as the abnormal image. As a result, it is possible to prevent the image having a possibility of the abnormal image from being stored as the normal image.

A substrate work system disclosed in the present description may be a substrate work system including a component mounting machine that mounts a component on a substrate, the component mounting machine including a component supply device configured to supply the component to be mounted on the substrate, a head having a nozzle capable of holding the component, a movement device configured to move the head in XY-directions, a control device configured to control the component supply device, the head, and the movement device such that a series of works including a pickup operation of picking up the component supplied from the component supply device by the nozzle of the head, a movement operation of moving the head to a predetermined position on the substrate, and a mounting operation of mounting the component picked up by the nozzle at the predetermined position is executed, and one or multiple cameras configured to image the component at least one imaging timing during execution of the series of works, and a substrate inspection machine disposed on downstream of the component mounting machine and configured to determine normality and abnormality of an appearance inspection based on an image for appearance inspecting obtained by imaging the substrate on which the component is mounted, in which the control device is configured to classify the image for appearance inspecting as the normal image in a case in which a result of determination of the normality and abnormality of the appearance inspection is normal, and classify the image for appearance inspecting and a part or all of images captured by the component mounting machine at imaging timings prior to the appearance inspection as the abnormal image in a case in which the result of the determination is abnormal.

INDUSTRIAL APPLICABILITY

The present disclosure can be applied to an industry accompanying an operation of mounting a component on a substrate.

REFERENCE SIGNS LIST

1: substrate work system, 2: communication network, 3: paste printing machine, 4: paste inspection machine, 5: mounting line, 6: reflow furnace, 7: substrate appearance inspection machine, 8a, 8b, 8c: intermediate conveyor, 10: component mounting module, 12: housing, 14: component supply device, 16: tape feeder, 16a: reel, 18: substrate conveyance device, 20: belt conveyor device, 22: substrate supporting device, 24: XY-robot, 26: Y-axis guide rail, 28: Y-axis slider, 29: Y-axis actuator, 30: X-axis guide rail, 32: X-axis slider, 33: X-axis actuator, 40: head unit, 41: suction nozzle, 42: nozzle holder, 42a: upper end portion, 42b: flange section, 44: rotary head, 44a: reflective body, 45: spring, 46: R-axis actuator, 47: rotation shaft, 48: drive motor, 49: Q-axis actuator, 50: Z-axis actuator, 52: ball screw nut, 54: screw shaft, 56: Z-axis slider, 57: lever section, 58: drive motor, 60: side camera, 62: camera main body, 62a: imaging element, 64: optical system, 68: solenoid valve, 70: part camera, 72: mark camera, 80: controller, 81: CPU, 82: ROM, 83: HDD, 84: RAM, 85: input and output interface, 86: bus, 90: management server, 91: CPU, 92: ROM, 93: HDD, 94: RAM, 95: input and output interface, 96: bus, 97: input device, 98: display, WP: work position, P, Pa to Pd1: component

The invention claimed is:

1. A component mounting machine that mounts a component on a substrate, the component mounting machine comprising:
    a component supply device configured to supply the component to be mounted on the substrate;
    a head having a nozzle capable of holding the component;

a movement device configured to move the head in XY-directions;

a control device configured to control the component supply device, the head, and the movement device such that a series of works including a pickup operation of picking up the component supplied from the component supply device by the nozzle of the head, a movement operation of moving the head to a predetermined position on the substrate, and a mounting operation of mounting component picked up by the nozzle at the predetermined position is executed; and one or multiple cameras configured to image the component at at least two imaging timings during execution of the series of works, wherein the control device is configured to control one of the one or multiple cameras to image the component when at the imaging timing during execution of the series of works, determine normality and abnormality of an operation of the series of works executed immediately before a current imaging timing based on an image captured at the current imaging timing, classify the image captured at the current imaging timing as a normal image in a case in which a result of determination of the normality and abnormality of the operation is normal, and classify the image captured at the current imaging timing and a part or all of images captured at imaging timings of prior operations of the series of works prior to the current imaging timing as an abnormal image in a case in which the result of the determination of the normality and abnormality of the operation is abnormal.

2. The component mounting machine according to claim 1, wherein the control device is configured to classify the image captured at the current imaging timing as the normal image and continue the series of works in a case in which the result of the determination of the normality and abnormality of the operation is normal, and classify the image captured at the current imaging timing and a part or all of the images captured at the imaging timings of the prior operations of the series of works prior to the current imaging timing as the abnormal image and cancel the series of works in a case in which the result of the determination of the normality and abnormality of the operation is abnormal.

3. The component mounting machine according to claim 1, wherein the imaging timing is at least two of a timing immediately after the pickup operation, a timing in a middle of the movement operation, and a timing immediately after the mounting operation.

4. The component mounting machine according to claim 1, wherein the series of works includes an appearance inspection of the substrate executed after the mounting operation, and the imaging timing is at least two of a timing immediately after the pickup operation, a timing in a middle of the movement operation, a timing immediately after the mounting operation, and a timing of the appearance inspection.

5. The component mounting machine according to claim 1, wherein the control device is configured to classify the image captured at the current imaging timing and all of the images captured at the imaging timings prior to the current imaging timing as the abnormal image in a case in which the result of the determination of the normality and abnormality of the operation is abnormal.

6. The component mounting machine according to claim 1, wherein the control device is configured to classify the image captured at the current imaging timing and an image captured at an imaging timing immediately prior to the current imaging timing and decided as the abnormal image in advance in a case in which the result of the determination of the normality and abnormality of the operation is made as abnormal.

7. The component mounting machine according to claim 1, wherein the image classified as the normal image is used in a case of editing component-related data.

8. A substrate work system comprising:

the component mounting machine according to claim 1; and a substrate inspection machine disposed downstream of the component mounting machine and configured to determine normality and abnormality of an appearance inspection based on an image for appearance inspecting obtained by imaging the substrate on which the component is mounted, wherein the control device is configured to classify the image for appearance inspecting as the normal image in a case in which a result of determination of the normality and abnormality of the appearance inspection is normal, and classify the image for appearance inspecting and a part or all of images captured by the component mounting machine at imaging timings prior to the appearance inspection as the abnormal image in a case in which the result of the determination is abnormal.

9. A substrate work system comprising:

a component mounting machine that mounts a component on a substrate, the component mounting machine including a component supply device configured to supply the component to be mounted on the substrate, a head having a nozzle capable of holding the component, a movement device configured to move the head in XY-directions, a control device configured to control the component supply device, the head, and the movement device such that a series of works including a pickup operation of picking up the component supplied from the component supply device by the nozzle of the head, a movement operation of moving the head to a predetermined position on the substrate, and a mounting operation of mounting component picked up by the nozzle at the predetermined position is executed, and one or multiple cameras configured to image the component at at least one imaging timing during execution of the series of works; and a substrate inspection machine disposed on downstream of the component mounting machine and configured to determine normality and abnormality of an appearance inspection based on an image for appearance inspecting obtained by imaging the substrate on which the component is mounted, wherein the control device is configured to classify the image for appearance inspecting as a normal image in a case in which a result of determination of the normality and abnormality of the appearance inspection is normal, and classify the image for appearance inspecting and a part or all of images captured by the component mounting machine related to the component at prior operations of the series of works at imaging timings prior to the appearance inspection as an abnormal image in a case in which the result of the determination is abnormal.

* * * * *